United States Patent [19]

Batova et al.

[11] 4,218,245
[45] Aug. 19, 1980

[54] NICKEL-BASE ALLOY

[76] Inventors: Margarita I. Batova, ulitsa Stroitelei, 7, korpus 1, kv. 66; Igor V. Meschaninov, ulitsa Petrozavodskaya, 5, korpus 2, kv. 353; Sergei G. Khajutin, B. Pirogovskaya ulitsa, 37-43, korpus B, kv. 52; Sergei L. Shapiro, Ryazansky prospekt, 67/2, kv. 106; Efim S. Shpichinetsky, Donskaya ulitsa, 6, kv. 93, all of Moscow, U.S.S.R.

[21] Appl. No.: 909,989

[22] Filed: May 26, 1978

[51] Int. Cl.$^2$ ............................................. C22C 19/03
[52] U.S. Cl. ........................................ 75/170; 75/171; 148/31.55; 148/32
[58] Field of Search ................... 75/170, 171; 148/32, 148/32.5, 31.55, 31.57

[56] References Cited

U.S. PATENT DOCUMENTS

| | | | |
|---|---|---|---|
| 2,833,646 | 5/1958 | Lee | 75/170 |
| 3,190,749 | 6/1965 | Fleming | 75/122 |

FOREIGN PATENT DOCUMENTS 1086674 10/1967 United Kingdom .

*Primary Examiner*—R. Dean
*Attorney, Agent, or Firm*—Haseltine, Lake & Waters

[57] ABSTRACT

A nickel-base alloy contains 0.05 to 6.5 percent by weight of manganese, 0.01 to 6.0 percent by weight of copper, 0.01 to 5.0 percent by weight of at least one element selected from the group consisting of titanium, vanadium, molybdenum, chromium, tungsten, niobium, tantalum, nickel being the balance.

This alloy has magnetostriction with a value thereof reaching $50 \times 10^{-6}$ after annealing carried out at a temperature of 700° to 1200° C.; the yield strength of this alloy is 6.5 to 20 kg per sq. mm.

1 Claim, No Drawings

NICKEL-BASE ALLOY

BACKGROUND OF THE INVENTION

The present invention relates to nonferrous metallurgy, and more particularly, to nickel-base alloys.

1. Field of the Application

The invention will find application in the production of magnetostrictive alloys which are widely used, for example, in manufacturing oscillators of sonic and ultrasonic frequency. Nickel-base alloys are also extensively employed in the fabrication of magnetostrictors used in the construction of hydrolocators and fathometers, for intensification of technological processes (e.g. in metallurgy), as well as for ultrasonic cleaning of workpieces. Drilling rigs have been recently developed on the basis of magnetostriction oscillators. Such drilling rigs are provided with magnetostrictors which are used to impart vibrating motion to an otherwise rotating boring tool. The operating efficiency of the tool is thus drastically increased.

2. Description of the Prior Art

Among the materials most frequently used for the production of magnetostrictors are commercially pure nickel and nickel alloy containing 4 percent by weight of cobalt.

The band fabricated from commercially pure nickel is estimated to have magnetostriction of $-35 \times 10^{-6}$, the band from nickel-cobalt alloy, depending on the production process, has magnetostriction equal to $-30 \times 10^{-6}$ to $-45 \times 10^{-6}$. Higher magnetostriction, in the event of nickel-cobalt alloy, is made possible due to vacuum melting and cold rolling with a deformation of 95 percent. The use of commercially pure nickel is disadvantageous in that it has limited magnetostriction which is impossible to raise (above $-40 \times 10^{-6}$).

The cobalt-nickel alloy mentioned above suffers from a disadvantage which lies in that it contains scarce and expensive cobalt. In addition, this alloy has low mechanical properties; after annealing the band at a temperature of 800° to 900° C., the yield strength thereof was $\delta_{0.2}=6$ kg.per sq.mm.

The band fabricated from commercially pure nickel is known to have magnetostriction equal to about $-50 \times 10^{-6}$. Such magnetostriction, however, is observed only in the case of the band annealing temperature not exceeding 700° to 750° C. According to the process of manufacturing magnetostrictive oscillators, the heating of band or strip is carried out at a temperature of up to 800° to 1000° C. At such temperature there takes place secondary recrystallization, and magnetostriction is brought down to a value of $-35 \times 10^{-6}$. Moreover, highly pure nickel is disadvantageous in that it has a low yield strength (about 4 kg. per sq. mm), which adversely affects its operating characteristics.

Known Ni-Co—base alloys (with additions of silicon contained in an mount of 2 percent by weight, or chromium in an amount of 2 percent by weight) have magnetostriction not exceeding $(-25$ to $35) \times 10^{-6}$.

There is also known an alloy which contains from 7 to 27 percent by weight of manganese, and one or more elements selected from the group consisting of iron (0–10 wt.%), vanadium (0–9 wt.%), silicon (0–5 wt.%), titanium (0–7 wt.%), molybdenum (0–8 wt.%), aluminum (0–6 wt.%), chromium (0–6 wt.%), tungsten (0–9 wt.%), antimony (0–11 wt.%), tin (0–10 wt.%), cobalt (0–22 wt.%), copper 0–10 wt.%), nickel, the balance.

This alloy has relatively low magnetostriction, not exceeding $-20 \times 10^{-6}$.

An object of the present invention is to provide a nickel-base alloy such that will have high magnetostriction value in addition to its high yield strength (high mechanical properties).

SUMMARY OF THE INVENTION

This object is accomplished by the provision of a nickel-base alloy containing manganese, copper, and at least one of the elements selected from the group consisting of titanium, vanadium, molybdenum, chromium, tungsten, niobium, tantalum, according to the invention, said components being included therein in the following amount:

| | Percent by weight |
|---|---|
| manganese | 0.05 to 6.5 |
| copper | 0.01 to 6.0 |
| at least one of the elements selected from the group consisting of titanium, vanadium, molybdenum, chromium, tungsten, niobium, tantalum | 0.01 to 5 |
| nickel, the balance. | |

The nickel-base alloy according to the invention has magnetostriction which reaches $-50 \times 10^{-6}$ after annealing effected at a temperature of 700° to 1200° C., its yield strength $\delta_{0.2}$ was 6.5 to 20 kg. per sq. mm.

Other objects of the invention will be better understood from a detailed description of a nickel-base alloy with reference to illustrative Examples.

DETAILED DESCRIPTION OF THE INVENTION

The invention provides a nickel-base alloy which contains alloying elements such as manganese and copper, and high-melting hardening elements such as titanium and/or vanadium and/or molybdenum and/or chromium and/or tungsten and/or niobium and/or tantalum.

The alloy components and their optimal content therein have been selected on the basis of the fact that magnetostriction depends upon the alloy structure and values of magnetostriction constants (these are maximal in pure nickel).

By adding alloying components to nickel, the two factors undergo changing. The selection of alloying elements and their content in the alloy are based on the following principles:

1. The alloying additives should have but a minimum possible effect on magnetostriction constants $\lambda_{100}$ and $\lambda_{III}$.

2. The alloy should be hardened to the highest possible degree.

3. If subjected to annealing in the air, the strip fabricated from the alloy should have on its surface a dense oxide film possessing high electric resistance and good metal-adhesion property.

Therefore, the most suitable alloying elements found for the purpose were copper and manganese which have a minimal effect (according to absolute value) on the constants $\lambda_{100}$ and $\lambda_{III}$; the most suitable alloy hardening elements have been found to be titanium, vanadium, molybdenum, chromium, tungsten, niobium, tantalum.

Minimum contents of the additives in the nickel-base alloy of the invention was determined on the basis of properties inherent in the above-mentioned oxide film and on the basis of the structure strength of the alloy when subjected to annealing, i.e. the higher the annealing temperature, the higher should be their concentration. Maximum contents of the additives in the alloy have been determined depending upon the highest possible magnetostriction and yield strength achieved.

It has been found that with the manganese content in the alloy being above 6.5 percent by weight and 0.01 percent by weight of copper, as well as the presence in the alloy of one or several high-melting elements, such as titanium, vanadium, molybdenum, chromium, tungsten, niobium and tantalum, in an amount above 5 percent by weight, magnetostriction is reduced to $(20-25) \times 10^{-6}$. At the same time, the above-indicated maximum contents permit the requisite stable structure of the alloy to be maintained at the annealing temperature ranging from 1100° to 1150° C. In addition, it has been experimentally found that an increase in the content of copper up to 6 percent by weight raises heat resistance of the alloy; any greater amount of copper in the alloy has practically no effect on its resistance to heat.

With the content of manganese in the alloy of the invention being less than 0.05 percent by weight, that of copper less than 0.01 percent by weight, and that of one or several high-temperature-resistant elements less than 0.01 percent by weight, the alloy structure becomes unstable already at a temperature of 750° C., which sharply decreases magnetostriction. Moreover, with a decrease in the minimum contents of said additives in the alloy, mechanical properties of the latter will not be higher than those of pure nickel, i.e. the alloy will have low yield strength.

Thus, the nickel-base alloy according to the invention, containing 0.05 to 6.5 percent by weight of manganese, 0.01 to 6 percent by weight of copper, and 0.01 to 5 percent by weight of titanium and/or vanadium and/or molybdenum and/or chromium and/or tungsten and/or niobum and/or tantalum, nickel being the balance, have magnetostriction reaching a value of $-50 \times 10^{-6}$ after annealing effected at a temperature of 700° to 1200° C., the alloy yield strength $\delta_{0.2}$ being in the range of from 6.5 to 15-20 kg. per sq. mm. By heating the strip fabricated from the alloy of the invention to a temperature of 700° to 1200° C., the surface thereof is covered with a dense oxide film, which makes it possible to manufacture a magnetostrictor in the form of a charged packet of strips. It is to be noted that in manufacturing powerful oscillators, the alloy of the invention used therein should contain the alloying elements in maximum amounts (mainly high-melting elements), though this will result in lower magnetostriction. For less powerful oscillators, the use of alloying elements should be more economical. This will ensure a higher magnetostriction value, with a yield strength being 6.5 to 8 kg. per sq. mm.

EXAMPLE 1

An alloy containing 95.5 percent by weight of nickel, 2.0 percent by weight of copper, 2.0 percent by weight of manganese and 0.5 percent by weight of titanium was melted in an induction furnace, in a magnesite crucible, in an atmosphere of argon. A charge in the form of cathode nickel and cathode copper is fed into the crucible and melted down, whereupon the metal is subjected to deoxidation by any conventional method. Weighed portions of manganese and titanium are then introduced therein. Further, the liquid alloy is cast in a cast-iron mold.

The resultant ingot 110 mm thick is rolled on a hot-rolling mill at a temperature of 1100° C. until it is reduced in thickness to 12 mm, whereupon the reduced ingot undergoes milling and cold rolling until it is reduced to a thickness of 0.2 mm, this being accompanied by intermediate annealing at a temperature of 750° C.

Samples $200 \times 10 \times 0.2$ mm in dimension are then cut out of the resultant band to determine magnetostriction and yield strength.

To gauge value, magnetostriction strain gauges series-connected each having 200 ohm in resistance and connected to bridge electric circuit, are attached to the sample from both sides thereof. Bridge balance is effected by means of a resistance box with an accuracy of up to $10^{-4}$ ohm. The sample is positioned into a solenoid wherein a magnetic field is produced with an intensity thereof ranging from 20 to 500 oersted. Magnetostriction present in the sample causes unbalance of the bridge circuit, which is registered by means of a photoelectronic amplifier and galvanometer. The value of unbalance $\Delta R$ is measured by secondary balancing of bridge, effected by means of the resistance box.

In saturation field the bridge unbalance was $\Delta R = = 375 \times 10^{-4}$ ohm. Magnetostriction is calculated with the following formula:

$$\lambda = \Delta R / RC,$$

where
R is the total resistance of the strain-sensitive gauges attached to the sample;
C is the sensitivity factor of the strain-sensitive gauges, equal to 2.04;

$$\lambda = \frac{375 \times 10^{-4}}{400 \times 2.04} = 46 \times 10^{-6}.$$

The yield strength of the tested sample was 9.5 kg. per sq. mm.

EXAMPLE 2

An alloy containing 93.48 percent by weight of nickel, 0.01 percent by weight of copper, 6.5 percent by weight of manganese, 0.01 percent by weight of niobium is melted in an induction furnace, in a magnesite crucible under flux. A charge in the form of cathode nickel and cathode copper is fed into the crucible to be melted down therein, with weighed portions of manganese and niobium being introduced thereafter. The liquid alloy is then cast in a cast-iron mold.

The resultant ingot 110 mm thick is hot-rolled at a temperature of 1100° C. until it is reduced in thickness to 12 mm, whereupon the reduced ingot undergoes milling and cold rolling to a thickness of 0.2 mm, this being accompanied by intermediate annealing effected at a temperature of 750° C.

Samples of $200 \times 10 \times 0.2$ mm in dimension are then cut out of the resultant band for the purpose of measuring magnetostriction and yield strength.

Value $\lambda$ was measured as described in Example 1.

The value of magnetostriction of the sample under testing was $-25 \times 10^{-6}$.

The yield strength of said sample was 17 kg. per sq. mm.

EXAMPLE 3

An alloy containing 94.8 percent by weight of nickel, 0.1 percent by weight of copper, 0.1 percent by weight of manganese and 5.0 percent by weight of chromium was melted in an induction furnace in a magnesite crucible in vacuum. A charge in the form of cathode nickel and cathode copper was fed into the crucible wherein it was melted down, with weighed portions of manganese and chromium being introduced into the melt. The liquid alloy was then cast in a cast-iron mold.

The resultant ingot 110 mm thick was hot-rolled at a temperature of 1100° C. until it was reduced to a thickness of 12 mm, whereupon the reduced ingot underwent milling and cold rolling to a thickness of 0.2 mm, this being accompanied by intermediate annealing effected at a temperature of 750° C.

Samples of 200×10×0.2 mm were then cut out of the resultant band for the purpose of measuring magnetostriction and yield strength.

Value $\lambda$ was measured as described in Example 1.

The value of magnetostriction of the sample under testing was $-25\times10^{-6}$.

The yield strength of said sample was 26 kg. per sq.mm.

EXAMPLE 4

An alloy containing 93.45 percent by weight of nickel, 6.0 percent by weight of copper, 0.05 percent by weight of manganese, and 0.5 percent by tungsten was melted in an induction furnace in a magnesite crucible in an atmosphere of argon. A charge in the form of cathode nickel and cathode copper was fed into the crucible to be melted down therein, whereupon the metal was subjected to deoxidation by any conventional method. Weighed portions of manganese and tungsten were then introduced into the melt. The liquid alloy was further cast in a cast-iron mold.

The resultant ingot 110 mm thick was hot-rolled at a temperature of 1100° C. until it was reduced in thickness to 12 mm, whereupon the reduced ingot underwent milling and cold-rolling operations until reduced to a band of 0.2 mm thick, this being accompanied by intermediate annealing conducted at a temperature of 750° C.

Samples of 200×10×0.2 mm thick were then cut out from the resultant band for the purpose of measuring magnetostriction and yield strength thereof.

Value $\lambda$ was measured as described in Example 1.

The value of magnetostriction of the sample under testing was $-48\times10^{-6}$.

The yield strength of said sample was 10 kg. per sq. mm.

EXAMPLE 5

An alloy containing 99.84 percent by weight of nickel, 0.01 percent by weight of copper, 0.05 percent by weight of manganese and 0.1 percent by weight of vanadium was melted in an induction furnace in a magnesite crucible under vacuum. A charge in the form of cathode nickel and cathode copper was fed into the crucible wherein it was melted down, whereupon the metal underwent deoxidation effected by any conventional method. Weighed portions of manganese and vanadium were introduced into the melt. The liquid alloy was thereafter cast in a cast-iron mold.

The resultant ingot 110 mm thick was hot-rolled at a temperature of 1100° C. until reduced to a thickness of 12 mm, whereupon the reduced ingot underwent milling and cold rolling operations until reduced to a thickness of 0.2 mm, this being accompanied by intermediate annealing effected at a temperature of 750° C.

Samples of 200×10×0.2 mm in dimension were then cut out from the resultant band for the purpose of measuring magnetostriction and yield strength thereof.

Value $\lambda$ was measured as described in Example 1.

The value of magnetostriction of the sample under testing was $-52\times10^{-6}$.

The yield strength of said sample was 5.5 kg. per sq.mm.

EXAMPLE 6

An alloy containing 96.5 percent by weight of nickel, 2.0 percent by weight of copper, 1.0 percent by weight of manganese and 0.5 percent by weight of molybdenum was melted in an induction furnace in a magnesite crucible under a layer of flux. A charge in the form of cathode nickel and cathode copper was fed into the crucible wherein it was melted down, whereupon the metal was subjected to deoxidation effected by any conventional method. Weighed portions of manganese and molybdenum were introduced into the melt. Further, the liquid alloy was cast in a mold. The resultant ingot 110 mm thick was hot-rolled at a temperature of 1100° C. until reduced at a thickness of 12 mm, whereupon the reduced ingot underwent milling and cold rolling operations until reduced to a thickness of 0.2 mm, this being accompanied by intermediate annealing conducted at a temperature of 750° C.

Samples of 200×10×0.2 mm in dimension were then cut out from the resultant band for the purpose of measuring magnetostriction strain and yield strength thereof.

Value $\lambda$ was measured as described in Example 1.

The value of magnetostriction strain of the sample under testing was $-48\times10^{-6}$.

The yield strength of said sample was 6.5 kg. per sq. mm.

EXAMPLE 7

An alloy containing 97.94 percent by weight of nickel, 1.0 percent by weight of copper, 1.0 percent by weight of manganese, 0.01 percent of weight of titanium and 0.05 percent by weight of molybdenum was melted in an induction furnace in a magnesite crucible in an atmosphere of argon. A charge in the form of cathode nickel and cathode copper was fed into the crucible wherein it was melted, whereupon the metal was subjected to deoxidation effected by any conventional method. Weighed portions of manganese, molybdenum and titanium were then introduced into the melt. The liquid alloy was further cast in a cast-iron mold.

The resultant ingot 110 mm thick was hot-rolled at a temperature of 1100° C. until reduced to a thickness of 12 mm, whereupon the reduced ingot underwent milling and cold rolling operations until reduced to a thickness of 0.2 mm, this being accompanied by intermediate annealing conducted at a temperature of 750° C.

Samples of 200×10×0.2 mm in dimension were cut from the resultant band for the purpose of measuring magnetostriction and yield strength thereof.

Value $\lambda$ was measured as described in Example 1.

The value of magnetostriction of the sample under testing was $-46\times10^{-6}$.

The yield strength of said sample was 7.0 kg. per sq.mm.

EXAMPLE 8

An alloy containing 97.1 percent by weight of nickel, 2.0 percent by weight of copper, 0.5 percent by weight of manganese, 0.1 percent by weight of molybdenum, 0.3 percent by weight of chromium was melted in an induction furnace in a magnesite crucible under a layer of flux. A charge in the form of cathode nickel and cathode copper was fed into the crucible, wherein it was melted down, whereupon weighed portions of manganese, molybdenum and chromium were introduced into the melt. The liquid alloy was further cast in a cast-iron mold.

The resultant ingot 110 mm thick was hot-rolled at a temperature of 1100° C. until reduced to a thickness of 12 mm, whereupon the reduced ingot underwent milling and rolling operations until reduced to a thickness of 0.2 mm, this being accompanied by intermediate annealing conducted at a temperature of 750° C.

Samples of 200×10×0.2 mm in dimension were cut from the resultant band for the purpose of measuring magnetostriction and yield strength thereof.

Value $\lambda$ was measured as described in Example 1.

The value of magnetostriction of the sample under testing was $-47 \times 10^{-6}$.

The yield strength of said sample was 7 kg. per sq.mm.

EXAMPLE 9

An alloy containing 96.85 percent by weight of nickel, 0.1 percent by weight of copper, 2.0 percent by weight of manganese, 1.0 percent by weight of chromium, 0.05 percent by weight of niobium was melted in an induction furnace in a magnesite crucible under vacuum. A charge in the form of cathode nickel and cathode copper was fed into the crucible wherein it was melted down, whereupon the metal was subjected to deoxidation effected by any conventional method. Weighed portions of manganese, chromium and niobium were introduced into the melt. The liquid alloy was then cast in a cast-iron mold.

The resultant ingot 110 mm thick was hot rolled at a temperature of 1100° C. until reduced to a thickness of 12 mm, whereupon the reduced ingot underwent milling and cold rolling operations until reduced to a thickness of 0.2 mm, this being accompanied by intermediate annealing conducted at a temperature of 750° C.

Samples of 200×10×0.2 mm in dimension were cut out from the resultant band for the purpose of measuring magnetostriction and yield strength thereof.

Value $\lambda$ was determined as described in Example 1.

The value of magnetostriction of the sample under testing was $-44 \times 10^{-6}$.

What we claim is:

1. A nickel-base alloy consisting essentially of 0.05 to 6.5 percent by weight of manganese, 0.01 to 6.0 percent by weight of copper, 0.01 to 5.0 percent by weight of at least one of the elements selected from the group consisting of titanium, vanadium, molybdenum, chromium, tungsten, niobium, and tantalum, nickel being the balance, said alloy having a magnetostriction which reaches $50 \times 10^{-6}$ after annealing effected at a temperature of 700° to 1200° C. and a yield strength $\epsilon 0.2$ of 6.5 to 20 kg per sq. mm.

* * * * *